(12) United States Patent
Thorson et al.

(10) Patent No.: US 7,508,670 B1
(45) Date of Patent: Mar. 24, 2009

(54) THERMALLY CONDUCTIVE SHELF

(75) Inventors: Kevin J. Thorson, Eagan, MN (US);
Gregory M. Drexler, Minnetonka, MN (US); Rick C. Stevens, Apple Valley, MN (US); Brian D. Sutterfield, Apple Valley, MN (US)

(73) Assignee: Lockheed Martin Corporation, Bethesda, MD (US)

( * ) Notice: Subject to any disclaimer, the term of this patent is extended or adjusted under 35 U.S.C. 154(b) by 16 days.

(21) Appl. No.: 11/893,036

(22) Filed: Aug. 14, 2007

(51) Int. Cl.
*H05K 7/20* (2006.01)

(52) U.S. Cl. ........................ 361/699; 361/689; 361/698; 174/15.1; 165/80.4; 165/104.33

(58) Field of Classification Search ................ None
See application file for complete search history.

(56) References Cited

U.S. PATENT DOCUMENTS

| | | | |
|---|---|---|---|
| 4,953,059 A | | 8/1990 | McNulty |
| 5,006,924 A | * | 4/1991 | Frankeny et al. ............ 257/714 |
| 5,245,508 A | * | 9/1993 | Mizzi ......................... 361/694 |
| 5,483,420 A | | 1/1996 | Schiavini |
| 5,552,984 A | | 9/1996 | Crandall et al. |
| 5,740,018 A | * | 4/1998 | Rumbut, Jr. ................. 361/720 |
| 6,084,771 A | * | 7/2000 | Ranchy et al. .............. 361/699 |
| 6,285,564 B1 | | 9/2001 | O'Brien |
| 6,587,345 B2 | * | 7/2003 | Chu et al. ................... 361/719 |
| 6,690,578 B2 | * | 2/2004 | Edelmann ................... 361/699 |
| 6,765,798 B1 | | 7/2004 | Ratliff et al. |
| 7,180,737 B2 | * | 2/2007 | Straub et al. ................ 361/690 |
| 7,188,662 B2 | | 3/2007 | Brewer et al. |
| 7,193,850 B2 | * | 3/2007 | Pal ............................. 361/700 |
| 7,324,336 B2 | * | 1/2008 | Vos et al. .................... 361/694 |
| 2007/0031686 A1 | | 2/2007 | Kendall |
| 2007/0054105 A1 | | 3/2007 | Hsiao |
| 2007/0107441 A1 | | 5/2007 | Lee |
| 2007/0297137 A1 | * | 12/2007 | Glahn et al. ................ 361/699 |

OTHER PUBLICATIONS

Astaphan, Alyssa. "Two-level maintenance: task force . . . ". Army Communicator, Fall 2005, http://findarticles.com/p/articles/mi_m0PAA/is_4_30/ai_n5979685/print, pp. 1-4.
Meyer, James. "Multi-function radar systems for the deployed warrior using VPX-REDI and RapidIO". Military Embedded Systems, Fall 2006.
Meyer, James. "Open-Standard Multicomputers Address Next-Generation . . . ". Defense Tech Briefs, Jun. 7, 2007, http://defense.techbriefs.com/content/view/976/36/, pp. 1-4.

(Continued)

*Primary Examiner*—Boris L Chervinsky
(74) *Attorney, Agent, or Firm*—Brooks, Cameron & Huebsch, PLLC

(57) ABSTRACT

Embodiments of the present disclosure include devices, systems, and methods. For example, one device embodiment of a thermally conductive shelf for operation with a conduction-cooled electronic module includes an expandable member defining a fluid passage between a first end and a second end, where the expandable member includes a first outer surface to contact a first conduction-cooled electronic module, an inlet located at a first end to receive a conductive fluid, and an outlet located at the second end to exhaust the conductive fluid.

31 Claims, 3 Drawing Sheets

OTHER PUBLICATIONS

Robles, Jim, et al. "A System Level View of Avionics/Vetronics . . . ". CoolCON 2004 Advanced Cooling Workshop, May 11, 2004.

Straznicky, Ivan. "Conduction Cooling-Is It Evolving to Meet the Needs?" Dy 4 Systems.

* cited by examiner

THERMALLY CONDUCTIVE SHELF

FIELD OF THE DISCLOSURE

The present disclosure relates to a thermally conductive shelf. In particular, the present disclosure relates to a thermally conductive shelf for operating with a conduction cooled electronic module.

BACKGROUND

Electronic module chassis which include multiple electronic modules mounted in the chassis are widely used in electronic applications. An electronic module chassis assembly may include a chassis configured to mechanically support the electronic modules, electrical connectors to interconnect the electronic modules, power supplies for operation of the electronic modules, and one or more external connectors to connect the electronic module assembly to external equipment.

Such electronic module chassis assemblies are used in military and aircraft applications, but are not limited to such applications. Electronic module chassis assemblies for military applications and other fields of use can be designed to operate reliably in harsh environments by increasing the ruggedness of the components and/or structure of the assembly.

Electronic components of electronic module chassis assemblies can generate heat, and can be operated with a cooling system to remove the heat and to maintain the electronic modules within a specified temperature range. The various cooling technologies utilized include conduction cooling, air-flow-through cooling, and/or liquid-flow-through cooling.

In some form factor instances, air-flow-through cooling may be used, for example, for up to 70 watts heat generation, conduction cooling may be used, for example, for up to 200 watts of heat generation, and liquid-flow-through cooling may be used, for example, for up to 500 watts heat generation. However, electronic modules may be trending toward higher speed and higher performance and generating larger amounts of heat. In addition, in some instances, maintenance exposure can be encumbered by some types of cooling forms.

SUMMARY

The present disclosure includes a number of system, device, and method embodiments. For example, according to a system embodiment, an electronic module chassis assembly is provided for operation with a conduction cooled electronic module. The chassis assembly includes a thermally conductive shelf extending between and in fluid communication with first and second sidewalls of the chassis and an expansion mechanism positioned adjacent to the shelf, where the expansion mechanism operates to expand the shelf, where at least a portion of a top surface of the shelf contacts a first electronic module, and where at least a portion of a bottom surface of the shelf contacts a second electronic module.

In such embodiments, the chassis first and second sidewalls can define a fluid passage, where the first sidewall includes a fluid inlet and the second sidewall includes a fluid outlet. Also, a fluid source can be coupled to the fluid inlet of the first sidewall. The inlet can receive a conductive fluid that passes through the first sidewall to the thermally conductive shelf, and the conductive fluid can flow to the second sidewall, where the conductive fluid can exhaust through the fluid outlet.

In some embodiments, the thermally conductive shelf includes an expandable member. The expandable member can, for example, be a bladder. The expandable member can, for instance, be a serpentine path to receive the conductive fluid. The expandable member can also define the top surface and/or bottom surface of the shelf and the expandable member can further define an array of expandable portions.

In some embodiments, the expansion mechanism can operate to increase fluid pressure inside the expandable member, thereby expanding the expandable member. The expansion mechanism can be one or more of a pneumatic cylinder, a hydraulic cylinder, an electric cylinder, and/or a valve coupled with a fluid pressure sensor. The expansion mechanism can be used to maintain contact between, for example, at least a portion of the top surface of the shelf and the bottom surface of an electronic module by maintaining a predetermined fluid pressure inside the expandable member.

The present disclosure also includes a number of device embodiments. For example, some device embodiments can include a thermally conductive shelf for operation with a conduction-cooled electronic module including an expandable member defining a fluid passage between a first end and a second end, where the expandable member includes a first outer surface to contact a first conduction-cooled electronic module, an inlet (e.g., located at the first end) to receive a conductive fluid in communication with a first sidewall of a chassis, and an outlet (e.g., located at the second end) to exhaust the conductive fluid in fluid communication with a second sidewall of the chassis.

The present disclosure also includes a number of method embodiments. For example, some method embodiments can include mounting the electronic module between first and second side walls of a chassis, flowing a conductive fluid through a thermally conductive shelf, where the shelf extends between and is in fluid communication with the first and second sidewalls, and expanding the shelf to bring at least a portion of a top surface of the shelf in contact with a bottom surface of the electronic module by adjusting the fluid pressure of the conductive fluid in the shelf.

In such a manner, heat generated by the electronic module can be conducted away from the module in the chassis assembly. This can be beneficial in that the electronic modules mounted on the chassis assembly can operate efficiently while the expandable shelf also provides inherent vibration damping, among other benefits.

DETAILED DESCRIPTION

Figure 1:
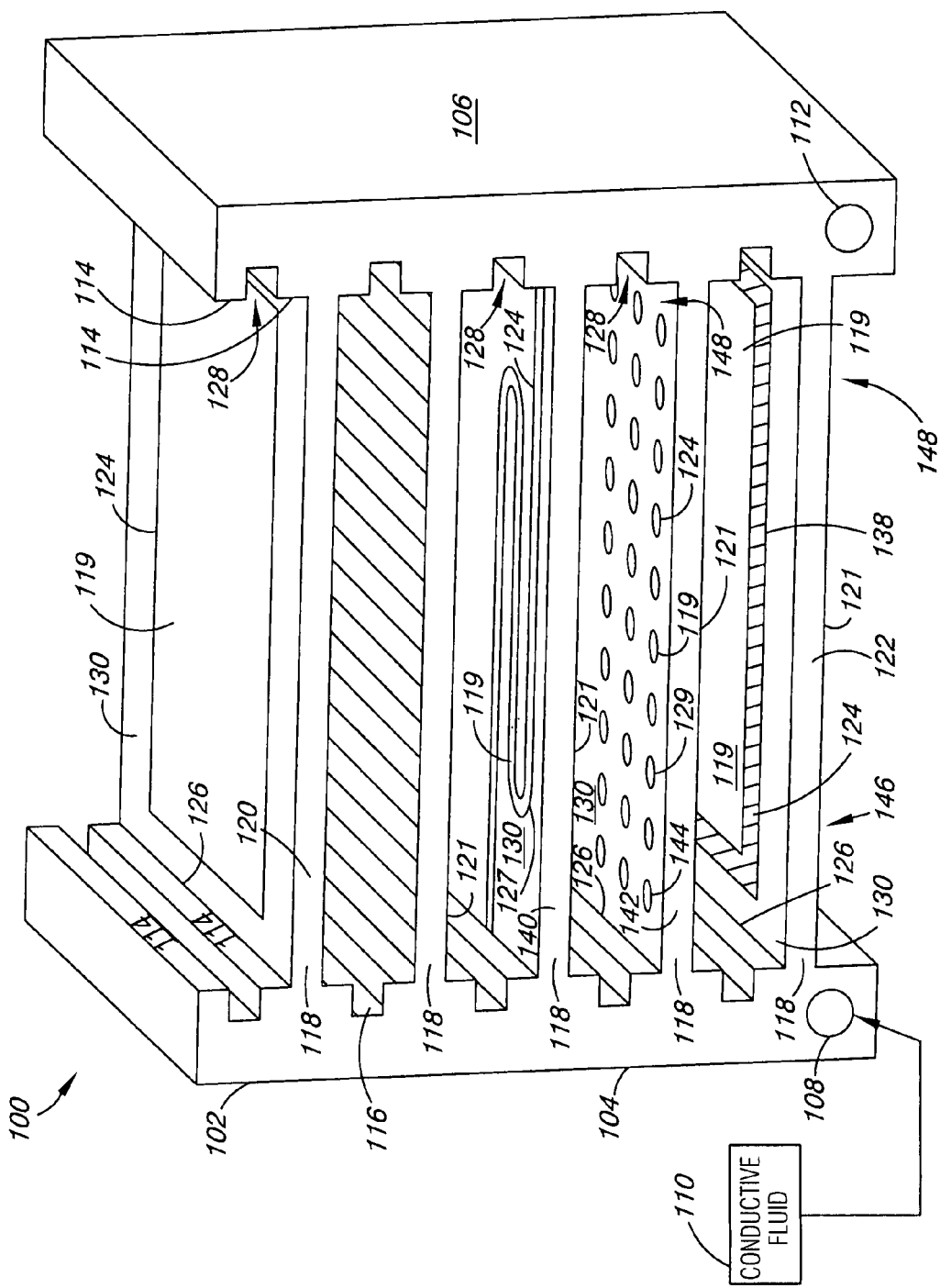
FIG. 1 is a perspective view of an electronic module chassis assembly according to an embodiment of the present disclosure.

The present disclosure includes a number of method, device, and system embodiments. Embodiments of the present disclosure will now be described in relation to the accompanying drawings, which will at least assist in illustrating various features of the various embodiments.

The figures herein follow a numbering convention in which the first digit or digits correspond to the drawing figure number and the remaining digits identify an element or component in the drawing. Similar elements or components between different figures may be identified by the use of similar digits. For example, 110 may reference element "10" in FIG. 1, and a similar element may be referenced as 210 in FIG. 2. The figures illustrated herein are not to scale.

FIG. 1 is a perspective view of an electronic module chassis assembly 100 according to an embodiment of the present disclosure. In the embodiment of FIG. 1, the chassis assembly 100 includes a chassis 102. As used herein, a "chassis" refers to a frame, or the framework, to which electronic components including, for example, an electronic module can be attached.

As shown in FIG. 1, the chassis 102 can include a first sidewall 104 and a second sidewall 106. Although FIG. 1 depicts the first sidewall 104 on the left of chassis 102, this configuration is not to be construed as limiting.

In the embodiment of FIG. 1, the first sidewall 104 and/or second sidewall 106 can be hollow to define a fluid passage for circulation of conductive fluid. In addition, the first sidewall 104 can include a fluid inlet 108 located at a side opening in the first sidewall 104. In various embodiments, the fluid inlet 108 can be located at a bottom opening in the first sidewall 104.

In the embodiment shown in FIG. 1, the fluid inlet 108 is located at the bottom opening in the first side wall 104. In some embodiments, the first sidewall 104 can include more than one fluid inlet 108 and/or can be placed in a different position. Also, in some embodiments, the fluid inlet 108 can be coupled to a conductive fluid source 110.

Similarly to the first sidewall 104, in some embodiments, the second sidewall 106 can include a fluid outlet 112, for example, located at a side opening and/or a bottom opening in the second sidewall 106. The fluid outlet 112 can serve as an exhaust for the conductive fluid pumped into the chassis 102 through the fluid inlet 108 located in the first sidewall 104, among other functions.

In some embodiments, the conductive fluid exhausted through the fluid outlet 112 can be recycled to the conductive fluid source 110. In some such embodiments, the conductive fluid source 110 can include a cooling jacket to cool the conductive fluid to a predetermined temperature. In various embodiments, the conductive fluid exhausted through the fluid outlet 112 can be disposed of rather than being recycled to the conductive fluid source 110.

The conductive fluid can be chosen from a gas, a liquid, or a mixture of both. In some embodiments, the conductive fluid can be a gas, for example, air, oxygen, carbon dioxide, and/or nitrogen, among others. In embodiments where the conductive fluid is a liquid, the conductive fluid can be water and/or oil, among other liquids. In some embodiments, the conductive fluid is a poly-alpha-olefin.

In various embodiments, a solid or solid-like conductive thermal ground plane material can be used in embodiments of the present disclosure. As used herein, "solid-like" can refer to a flat, thermal ground plane formed using heat pipe technology. As one skilled in the art will appreciate, inside a heat pipe, at a hot interface a fluid (e.g., water) turns to vapor and the gas naturally flows and condenses on a cold interface. The liquid falls or is moved by capillary action back to the hot interface to evaporate again and repeat the cycle.

As shown in the embodiment of FIG. 1, the first sidewall 104 and/or second sidewall 106 can each include spaced-apart rails 114 which define mounting locations for the electronic module 116 and additional electronic modules 116. As such, the electronic module 116 can be mounted in the chassis 102. In some embodiments, the chassis 102 can be configured to hold, for example, fifteen to twenty, or more or less, electronic modules 116, one of which is shown in FIG. 1.

As will be appreciated by one skilled in the art, the chassis 102 can be configured as a rack for supporting multiple electronic modules 116 and may include edge connectors for interconnecting the electronic modules 116. The chassis 102 may also provide mounting for one or more power supplies for operation of the electronic modules 116 and one or more connectors for connection to external equipment.

The configuration of the chassis 102 may vary according to its intended application. As such, the chassis 102 may be configured for different electronic modules 116 in different applications.

The electronic module 116 can include a printed circuit board (PCB) having a number of electronic devices located thereon, for example, and without limitation, processors, memory, storage devices, I/O elements, and the like. In various embodiments, each electronic module 116 includes a connector for engaging a connector of the chassis 102.

In some embodiments, at least a portion of the electronic modules 116 included in the chassis assembly 100 can produce high (e.g., more than approximately 150 Watts (W)) of thermal energy each when in steady-state operation.

To enable the electronic modules 116 mounted in the chassis 102 to operate without overheating or malfunctioning, the thermal energy (i.e., heat) formed during operation can be dissipated using conductive heat transfer. As shown in FIG. 1, the chassis assembly 100 includes a thermally conductive shelf 118 that extends between and can be in fluid communication with the first sidewall 104 and/or the second sidewall 106 of the chassis 102.

As used herein, the "thermally conductive shelf" refers to a member connecting the first sidewall 104 and the second sidewall 106. The term "shelf" is not intended to imply that the electronic modules 116 are supported by the thermally conductive shelf 118, rather, the electronic modules 116 are supported by the rails 114 included in the chassis 102, as discussed herein. However, the thermally conductive shelf 118 can provide some vibration damping and/or support to the electronic module 116.

In the embodiment of FIG. 1, the shelf 118 can include a first outer surface 119 and a second outer surface 121. As used herein, the "first outer surface" and "second outer surface" of the shelf 118 each refer to a surface that contacts an electronic module (e.g., electronic module 116) to conduct thermal energy from the one or more electronic modules.

In some embodiments, the entire surface (e.g., surface 119 or 121) does not contact the electronic module 116; but at least a portion of the first outer surface 119 and second outer surface 121 contact the electronic module 116. The reader will appreciate that the second outer surfaces 121 may have the same or a different configuration as the first outer surfaces 119.

As shown in FIG. 1, the thermally conductive shelf 118 can be designed differently in various embodiments, as will be discussed in more detail herein. As such, the chassis assembly 100 can include thermally conductive shelves 118 that are the same throughout the chassis 102, or one or more shelves 118 that are different throughout the chassis 102.

For example, the chassis assembly 100 embodiment illustrated in FIG. 1 includes four different designs of the thermally conductive shelf 118. Some chassis assemblies can include shelves the same or similar to the uppermost shelf 120 throughout the chassis 102, while other chassis assemblies 100 can alternate between shelves similar to the uppermost shelf 120 and shelves similar to the lowermost shelf 122. Other arrangements are also possible.

In some embodiments, the thermally conductive shelf 118 can include one or more expandable members (e.g., such as member 124) that define a fluid passage, for example, between a first end 126 and a second end 128. In various embodiments, the expandable member 124 can be a bladder. In some embodiments, the expandable member 124 (e.g., bladder) can be a serpentine hose 127, as illustrated in FIG. 1.

In various embodiments, the expandable member can define an array of expandable portions 129. For example, when the expandable member is expanded, the expandable portions 129 can resemble an array of projections, dimples, or bumps, on the expandable member 124. The projections can be of any suitable shape. In some such embodiments, the expandable portions 129 contact the electronic module 116 when the expandable member 124 is expanded.

In some embodiments, the expandable member 124 can be formed of a rigid, conductive material, where the first outer surface 119 and the second outer surface 121 can be coupled to a conductive support 130, or outer ring, of the expandable member 124 with an expandable material 138. In some embodiments, the first outer surface 119 and/or second outer surface 121 can be formed of the same material as the conductive support 130.

In various embodiments, the first outer surface 119 and/or second outer surface 121 can be formed of a different material as the conductive support 130. For example, the first outer surface 119 and/or second outer surface 121 can be formed of a material with a higher conductivity than the conductive support 130 material.

In some embodiments, the expandable material 138 can be, for example, a resilient membrane (e.g., a rubber membrane) that is adhered (e.g., glued) to the first outer surface 119 and/or second outer surface 121, and the conductive support 130 of the expandable member 124. In some such embodiments, the resilient membrane can be formed in an expandable shape (e.g., an accordion-like configuration) to enable at least a portion of the first outer surface 119 and/or second outer surface to rest parallel with the surface of the conductive support 130 when the expandable member 124 is not expanded.

In some embodiments, the shelf 118 can include a second expandable member defining a second fluid passage positioned adjacent an interior surface of the expandable member 124. As discussed further herein, in some such embodiments, the second expandable member can be an expansion mechanism to bring the first outer surface 119 and/or second outer surface 121 into contact with the electronic module 116.

As shown in the embodiment of FIG. 1, in some embodiments, the thermally conductive shelf 118 can include the conductive support 130 around the expandable member 124. For example, in embodiments where the expandable member 124 is a bladder, the shelf 118 can include the conductive support 130 to provide support for the bladder. The conductive support 130 can prevent the bladder from separating from the first sidewall 104 and second sidewall 106 of the chassis 102 due to the pressure of the conductive fluid as it flows through the bladder.

As shown in FIG. 1, the conductive support 130 can have a frame structure, as illustrated for the uppermost shelf 120. In some embodiments, the conductive support 130 can have a structure to provide support for a serpentine path 127, as shown for shelf 140.

In addition, in various embodiments, the conductive support 130 can have a structure where the conductive support 130 completely surrounds the bladder except for an array of openings 144 in the conductive support 130 that align with expandable portions 129 of the bladder, as shown for shelf 142. In some such embodiments, the expandable portions 129 of the bladder can expand through openings 144 of the conductive support 130 to contact the electronic module 116.

As discussed herein, the expandable member 124 in the embodiment of FIG. 1 defines a fluid passage between a first end 126 and a second end 128. In addition, in some embodiments, such as that illustrated in FIG. 1, the shelf 118 includes inlets 146 located at the first end 126 to receive a conduction fluid. In such embodiments, the one or more inlets 146 can be, for example, in fluid communication with the first sidewall 104.

In some embodiments, such as that illustrated in FIG. 1, the shelf 118 also includes one or more outlets 148 located at the second end 128 to exhaust the conduction fluid. In such embodiments, outlet 148 can, for example, be in fluid communication with the second wall 106 of the chassis 102.

As discussed herein, the first sidewall 104 and/or second sidewall 106 of the chassis 102 can be hollow to define a fluid passage for circulation of conductive fluid. In some such embodiments, the first sidewall 104 and/or second sidewall 106 can be formed with one or more apertures (e.g., adjacent to each thermally conductive shelf 118), where the aperture can, for example, be aligned with the inlet 146 and outlet 148.

In some embodiments, the aperture can be formed such that the size of the aperture is larger than the size of the inlet 146 and outlet 148. In some such embodiments, the shelf 118 can have an adjustable height while maintaining operability. The adjustable height can be beneficial in that it can aid in maintaining contact between the first outer surface 119 and/or the second bottom surface 121 of the expandable member 124 and the electronic module 116.

In some embodiments, the first sidewall 104 and/or second sidewall 106 can be formed integrally with the conductive support 130 of one or more of the shelves 118. In some such embodiments, the expandable member 124 can be attached to the conductive support 130 such that the inlet 146 and/or outlet 148 align with the hollow first sidewall 104 and/or second sidewall 106.

Figure 2:
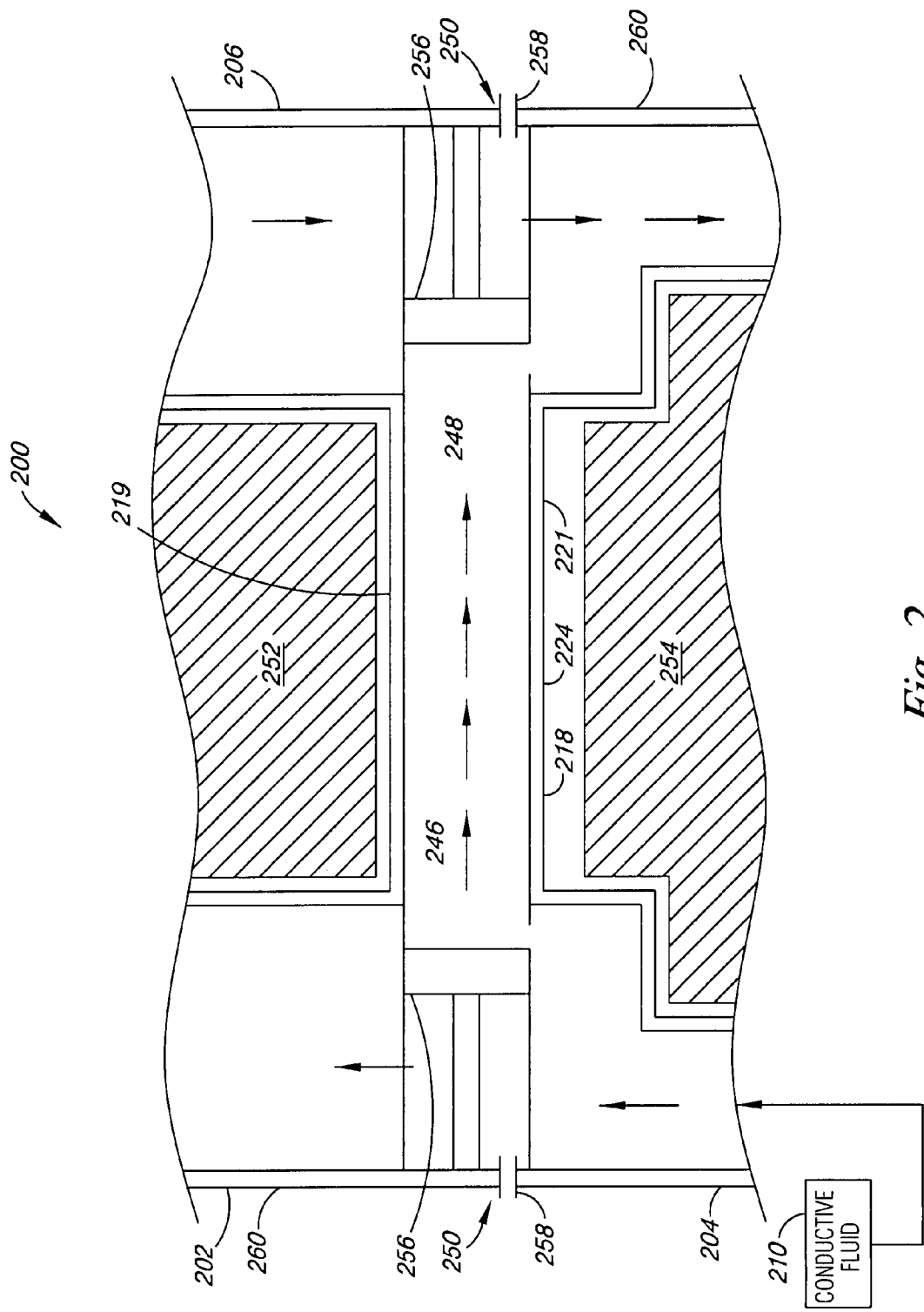
FIG. 2 is a cross-sectional view of the electronic module chassis assembly according to an embodiment of the present disclosure.

FIG. 2 is a cross-sectional view of the electronic module chassis assembly 200 according to an embodiment of the present disclosure. As shown in FIG. 2, the chassis assembly 200 can include an expansion mechanism 250 located adjacent to the shelf 218, where the expansion mechanism 250 operates to expand a portion of the shelf 218.

As discussed herein, in the embodiment of FIG. 2, the shelf 218 includes an expandable member 224, as discussed herein. The expansion mechanism 250 can operate to increase the fluid pressure inside the shelf 218 to expand the expandable member 224.

By expanding the expandable member 224, at least a portion of the first outer surface 219 contacts a first electronic module 252 and at least a portion of the second outer surface 221 contacts a second electronic module 254. The first electronic module 252 and second electronic module 254 can include a PCB having a number of electronic devices located thereon that can generate thermal energy, as discussed herein.

By expanding the expandable member 224 to enable portions of the expandable member to contact the electronic modules 252 and/or 254, fluid flowing through the shelf 218 can conduct thermal energy away from the electronic modules 252 and/or 254. In the present disclosure, thermal energy generated by the electronic modules 252 and/or 254 can be dissipated through thermal conduction between the electronic modules 252 and/or 254 and the expandable member 224 of the thermally conductive shelf 218.

As discussed herein, in the embodiment of FIG. 2, the conductive fluid can flow from the first sidewall 204 to the inlet 246 of the shelf 218. The conductive fluid entering the shelf 218 can be at a predetermined temperature that is lower than the temperature of the electronic modules 252 and/or 254. As the conductive fluid flows through the shelf 218, the conductive fluid can absorb the thermal energy (e.g., heat), raising the temperature of the conductive fluid as it exits the shelf 218 through the outlet 248.

In some embodiments, the warmed conductive fluid can be exhausted from the chassis (e.g., chassis 202) through the second sidewall (e.g., second sidewall 206) and recycled to conductive fluid source 210. As discussed herein, in some such embodiments, the conductive fluid source can include a cooling jacket to cool the conductive fluid to a predetermined lower temperature. In various embodiments, the warmed conductive fluid can be exhausted from the chassis 202 and disposed of.

In some embodiments, the expansion mechanism 250 can be a pneumatic cylinder powered by compressed gas (e.g., air). To perform its function, pneumatic cylinders impart a force by converting the potential energy of compressed gas into kinetic energy.

The pneumatic cylinder can be a single acting cylinder, where the force imparted by air moves the piston 256 in one direction and a spring can return the piston to a "home" position. The home position can, for example, be a position closer to the outside surface 260 of the sidewall 204 and/or 206.

In some embodiments, the expansion mechanism 250 can be a hydraulic cylinder powered by hydraulic fluid under pressure. The hydraulic cylinder can be similar to a pneumatic cylinder, using hydraulic fluid under pressure rather than compressed air.

In some embodiments, the hydraulic cylinder can be a plunger type cylinder, where the cylinder is a pushing type cylinder. A pushing type cylinder typically only works in one direction, so the hydraulic fluid can enter the cylinder 250 at the entrance 258 to push the piston 256 toward the inlet 246 of the shelf 218. In some such embodiments, the cylinder can include an outlet to drain the hydraulic fluid from the cylinder.

In some embodiments, the expansion mechanism 250 can be an electric cylinder powered by, for example, a direct current (DC) motor. The electric cylinder can also be powered by a servo motor and/or a stepper motor. As one skilled in the art will appreciate, the electric cylinder can be similar in configuration and appearance to hydraulic or pneumatic cylinders.

As discussed herein, the expansion mechanism 250 can operate to increase the fluid pressure inside the shelf 218 to expand the expandable member 224. In some embodiments, the expansion mechanism 250 can be used to maintain the increased fluid pressure inside the expandable member 224 to keep contact between the expandable member 224 and the electronic modules 252 and/or 254.

In some embodiments, the chassis assembly 200 can include a fluid pressure sensor to monitor the fluid pressure inside the expandable member 224. In some such embodiments, the expansion mechanism 250 can be coupled to the sensor and can increase or decrease the rate at which conductive fluid flows into the shelf 218 based on the fluid pressure sensed. In some embodiments, the fluid pressure inside the shelf 218 can be maintained at a predetermined pressure.

Figure 3:
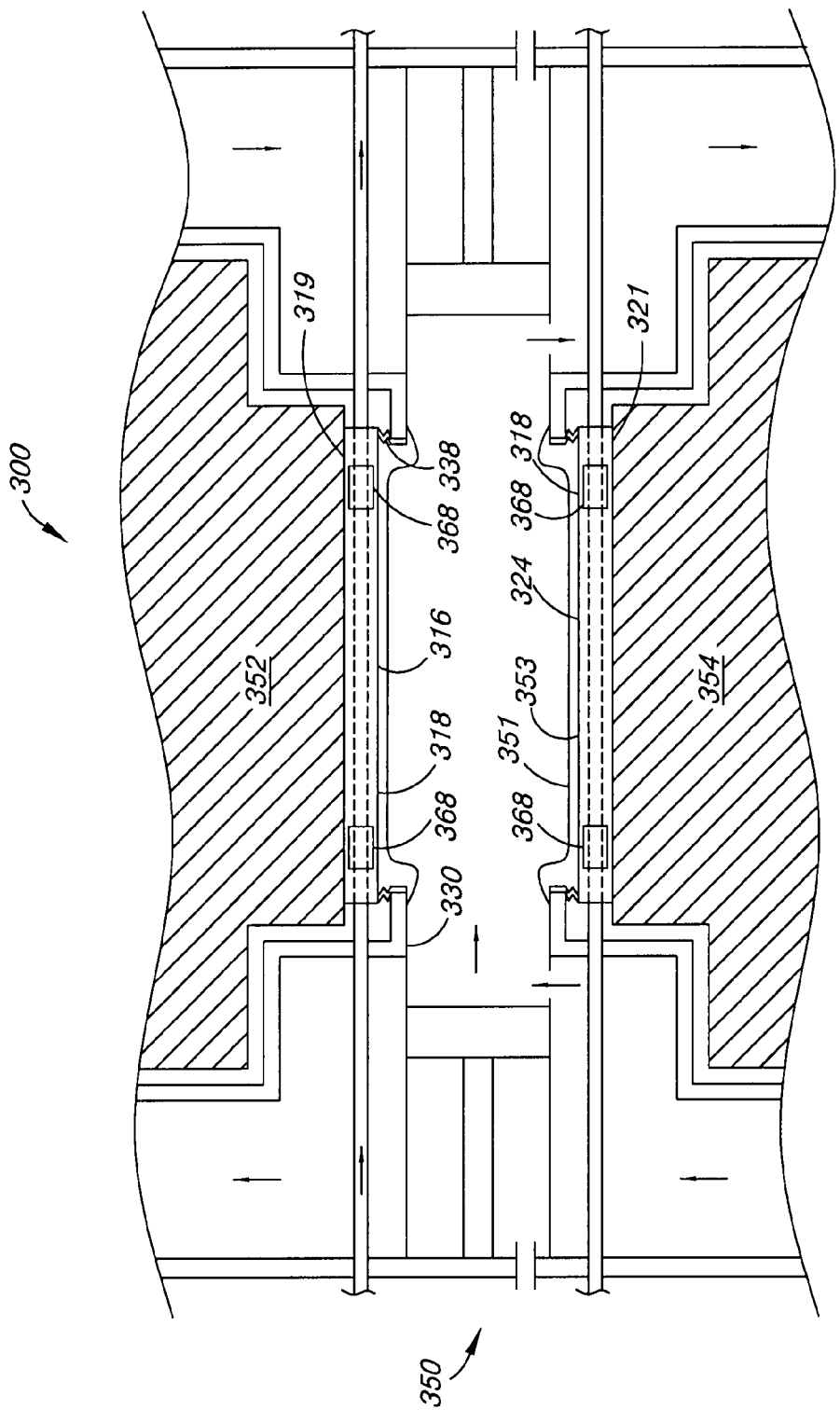
FIG. 3 is a cross-sectional view of the electronic module chassis assembly according to an embodiment of the present disclosure.

FIG. 3 is a cross-sectional view of the electronic module chassis assembly 300 according to an embodiment of the present disclosure. FIG. 3 illustrates an additional embodiment of the expansion mechanism 350 and the shelf 318.

As illustrated in the embodiment of FIG. 3, the shelf 318 includes a conductive support 330 surrounding the expandable member 324, where the expandable member 324 can include a rigid, conductive material portion coupled to the conductive support 330 with an expandable material 338, as discussed herein. As discussed herein, in such embodiments, the expandable member 324 included in the shelf 318 is expandable by way of the expandable material 338.

In addition, in some embodiments, the expandable member 324 can receive the conductive fluid through flexible hoses that extend from the outside of the chassis assembly 300 to the expandable member 324. In some such embodiments, the flexible hoses can move with the expandable member 324 when the expandable material 338 is expanded and/or contracted.

In some embodiments, the shelf 318 can include a second expandable member 351 defining a second fluid passage. The second expandable member 351 (e.g., a bladder or a serpentine path) can be positioned adjacent an interior surface 353 of the expandable member 324. In some such embodiments, the second expandable member 351 can act as an expansion mechanism 350 to bring the first outer surface 319 and second outer surface 321 into contact with the first electronic module 352 and second electronic module 354.

In some embodiments, the second expandable member 351 can be a bladder. In various embodiments, the second expandable member 351 can be a serpentine path. In some such embodiments, the conductive fluid can flow through the expandable member 324 to conduct heat away from the first electronic module 352 and second electronic module 354.

In addition, a second conductive fluid can flow into the second expandable member 351 to expand the second expandable member 351. By expanding the second expandable member 351, the expandable material 338 coupling the rigid, conductive material (i.e., expandable member 324) to the conductive support 330 can be expanded. Expanding the expandable material 338 can bring the first outer surface 319 and second outer surface 321 into contact with the first electronic module 352 and second electronic module 354.

In some embodiments, the conductive fluid flowing through the expandable member 324 can be the same as the second conductive fluid flowing through the second expandable member 351. In various embodiments, the conductive fluid flowing through the expandable member 324 can be different than the second conductive fluid flowing through the second expandable member 351.

In some embodiments, a fluid pressure inside the second expandable member 351 can be achieved and maintained using at least one of a pneumatic cylinder, a hydraulic cylinder, and an electric cylinder, as discussed herein. In some such embodiments, the chassis assembly 300 can include a fluid pressure sensor to monitor the fluid pressure inside the second expandable member 351. The pneumatic cylinder, hydraulic cylinder, and/or electric cylinder can be coupled to the sensor and can increase or decrease the rate at which the second conductive fluid flows into the second expandable member 351 based on the fluid pressure sensed, as discussed herein.

In some embodiments, the shelves 318 can include a securing mechanism 368 to secure the electronic modules 316 to the chassis 302. Securing the shelves 318 in place on the chassis 302 can increase the likelihood that contact is maintained between the expandable members 324 and the electronic modules 316 to efficiently conduct thermal energy away from the electronic modules 316.

In some embodiments, the securing mechanism 368 can be a series of clamps positioned oppositely on the shelves 318, where a user can, for example, move one and/or both clamps toward the other clamp to provide a force on the electronic modules 316.

In various embodiments, the securing mechanism 368 can include a sensor and an activator, where the securing mechanism 368 can be activated when an electronic module 316 is, for example, placed in the chassis (e.g., chassis 302). The securing mechanism 368 can then, for example, decrease the distance between a clamp and the electronic module 316 surface until the sensor senses a predetermined force exerted on the electronic module 316. Other securing mechanisms 368 are also possible.

Although specific embodiments have been illustrated and described herein, those of ordinary skill in the art will appreciate that any arrangement calculated to achieve the same techniques can be substituted for the specific embodiments shown. This disclosure is intended to cover adaptations or variations of various embodiments of the present disclosure.

It is to be understood that the above description has been made in an illustrative fashion, and not a restrictive one. Combination of the above embodiments, and other embodiments not specifically described herein will be apparent to those of ordinary skill in the art upon reviewing the above description.

The scope of the various embodiments of the present disclosure includes various other applications in which the above structures and methods are used. Therefore, the scope of various embodiments of the present disclosure should be determined with reference to the appended claims, along with the full range of equivalents to which such claims are entitled.

In the foregoing Detailed Description, various features are grouped together in a single embodiment for the purpose of streamlining the disclosure. This method of disclosure is not to be interpreted as reflecting an intention that the embodiments of the present disclosure require more features than are expressly recited in each claim.

Rather, as the following claims reflect, inventive subject matter may lie in less than all features of a single disclosed embodiment. Thus, the following claims are hereby incorporated into the Detailed Description, with each claim standing on its own as a separate embodiment.

What is claimed:

1. A thermally conductive shelf for operation with a conduction-cooled electronic module, comprising:
   an expandable member defining a fluid passage between a first end and a second end, where the expandable member includes a first outer surface to contact a first conduction-cooled electronic module;
   an inlet located at the first end to receive a conductive fluid, the inlet is in fluid communication with a first sidewall of a chassis; and
   an outlet located at the second end to exhaust the conductive fluid, the outlet is in fluid communication with a second sidewall of the chassis.

2. The shelf of claim 1, where the expandable member is a bladder.

3. The shelf of claim 1, where the expandable member is a serpentine path.

4. The shelf of claim 1, where the expandable member defines an array of expandable portions of the expandable member.

5. The shelf of claim 4, where the shelf includes a conductive support positioned around the expandable member, where the conductive support defines an array of openings positioned over the expandable member, and where the expandable portions expand through the array of openings.

6. The shelf of claim 1, where the shelf includes a conductive support surrounding the expandable member and the expandable member includes a rigid, conductive material portion coupled to the conductive support with an expandable material.

7. The shelf of claim 6, where the expandable member is a solid-like conductive thermal ground plane material.

8. The shelf of claim 6, where the shelf includes a second expandable member defining a fluid passage positioned adjacent an interior surface of the expandable member.

9. The shelf of claim 8, where the second expandable member is a bladder.

10. The shelf of claim 1, where the expandable member includes a second outer surface to contact a second conduction-cooled electronic module.

11. An electronic module chassis assembly, comprising:
    a chassis including spaced-apart first and second sidewalls;
    a thermally conductive shelf extending between and in fluid communication with the first and second sidewalls, where the shelf includes a first outer surface and a second outer surface; and
    an expansion mechanism located adjacent to the shelf, where the expansion mechanism operates to expand a portion of the shelf, and at least a portion of the first outer surface contacts a first electronic module and at least a portion of the second outer surface contacts a second electronic module to conduct heat away from the first and second electronic module.

12. The chassis assembly of claim 11, where the first and second sidewalls include spaced-apart rails defining mounting locations for the first and second electronic modules.

13. The chassis assembly of claim 11, where the first and second sidewalls define a fluid passage, where the first sidewall includes a fluid inlet and the second sidewall includes a fluid outlet.

14. The chassis assembly of claim 13, where the chassis assembly includes a conductive fluid source coupled to the fluid inlet of the first sidewall.

15. The chassis assembly of claim 11, where the shelf includes an expandable member.

16. The chassis assembly of claim 11, where the expandable member defines the top surface and bottom surface of the shelf, and the expandable member further defines an array of expandable portions.

17. The chassis assembly of claim 16, where the expansion mechanism operates to increase fluid pressure inside the expandable member to expand the expandable portions of the expandable member, where the portion of the first outer surface contacting the first electronic module and the portion of the second outer surface contacting the second electronic module are the expandable portions of the expandable member.

18. The chassis assembly of claim 17, where the shelf further includes a conductive support positioned around the expandable member, where the conductive support defines an array of openings positioned over the expandable member, and where the expandable portions expand through the array of openings.

19. The chassis assembly of claim 11, where the expansion mechanism is at least one of a pneumatic cylinder, a hydraulic cylinder, and an electric cylinder.

20. The chassis assembly of claim 11, where the expansion mechanism is a second expandable member.

21. A method of cooling an electronic module, comprising:
    mounting the electronic module between first and second sidewalls of a chassis;
    flowing a conductive fluid through a thermally conductive shelf, where the shelf extends between and is in fluid communication with the first and second sidewalls; and expanding the shelf to bring at least a portion of a first outer surface of the shelf in contact with a bottom surface of the electronic module.

22. The method of claim 21, where expanding the shelf includes adjusting the fluid pressure of the conductive fluid in the shelf.

23. The method of claim 21, where the method includes mounting a second electronic module between the first and second side walls of the chassis below the shelf.

24. The method of claim 23, where expanding the shelf further includes bringing at least a portion of a second outer surface of the shelf into contact with a top surface of the second electronic module.

25. The method of claim 21, where flowing the conductive fluid through the thermally conductive shelf includes:
   coupling a conductive fluid source to a fluid inlet in the first sidewall; and
   pumping the conductive fluid from the conductive fluid source through the first sidewall to the shelf, where the conductive fluid flows through the shelf to the second sidewall and exhausts through a fluid outlet in the second sidewall.

26. The method of claim 21, where the shelf is an expandable member and the method includes monitoring a fluid pressure inside the expandable member to maintain contact between at least the portion of the first outer surface of the shelf and the bottom surface of the electronic module.

27. The method of claim 26, including maintaining a fluid pressure inside the expandable member at a predetermined fluid pressure using at least one of a hydraulic cylinder, a pneumatic cylinder, and an electric cylinder.

28. The method of claim 26, where expanding the shelf to bring at least the portion of the first outer surface of the shelf in contact with the bottom surface of the electronic module includes flowing a second conductive fluid through a second expandable member positioned adjacent an interior surface of the thermally conductive shelf.

29. The method of claim 28, including maintaining a fluid pressure inside the second expandable member at a predetermined fluid pressure using at least one of a hydraulic cylinder, a pneumatic cylinder, and an electric cylinder.

30. The method of claim 21, including securing the electronic module between the first and second sidewalls of the chassis.

31. The method of claim 30, where securing the electronic module includes clamping the electronic module with one or more clamps that provide force on the electronic module toward at least one of the first and second sidewall of the chassis.

* * * * *